US006977717B1

(12) United States Patent
Lalovic et al.

(10) Patent No.: US 6,977,717 B1
(45) Date of Patent: Dec. 20, 2005

(54) METHOD AND DEVICE FOR DETERMINING PROJECTION LENS PUPIL TRANSMISSION DISTRIBUTION AND ILLUMINATION INTENSITY DISTRIBUTION IN PHOTOLITHOGRAPHIC IMAGING SYSTEM

(75) Inventors: Ivan Lalovic, Mountain View, CA (US); Bruno M. LaFontaine, Pleasanton, CA (US); Jongwook Kye, Pleasanton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 119 days.

(21) Appl. No.: 10/727,385

(22) Filed: Dec. 4, 2003

(51) Int. Cl.$^7$ .......................... G03B 27/42; G03B 27/54
(52) U.S. Cl. .......................................... 355/67; 355/53
(58) Field of Search ............................. 355/67, 53, 55, 355/77; 359/366; 700/59; 356/121, 400, 356/401; 250/548

(56) References Cited

U.S. PATENT DOCUMENTS

| | | | | |
|---|---|---|---|---|
| 4,000,949 A | * | 1/1977 | Watkins ..................... 356/165 |
| 5,153,989 A | * | 10/1992 | Kondo et al. ................ 379/34 |
| 5,300,967 A | * | 4/1994 | Kamon ....................... 353/97 |
| 5,396,311 A | * | 3/1995 | Fukushima et al. ........... 355/71 |
| 5,420,417 A | * | 5/1995 | Shiraishi .................... 250/205 |
| 5,461,456 A | * | 10/1995 | Michaloski .................. 355/67 |
| 5,973,771 A | * | 10/1999 | Hibbs et al. ................ 356/121 |
| 2003/0043356 A1 | * | 3/2003 | Shiraishi .................... 355/53 |
| 2003/0091913 A1 | * | 5/2003 | Shiode ....................... 430/22 |
| 2003/0099034 A1 | * | 5/2003 | Mann et al. ................ 359/359 |
| 2004/0218262 A1 | * | 11/2004 | Chuang et al. ............. 359/366 |

OTHER PUBLICATIONS

Tichenor et al.; "System Integration and Performance of the EUV Engineering Test Stand"; Workshop on Extreme Ultraviolet Lithography; Oct. 17-19, 2000.*

* cited by examiner

*Primary Examiner*—Peter B. Kim
(74) *Attorney, Agent, or Firm*—Renner, Otto, Boisselle & Sklar, LLP (57) ABSTRACT

A method and device for determining projection lens pupil transmission distribution in a photolithographic imaging system, the device including an illumination source; a transmissive reticle; an aperture layer having an illumination source side and a light emission side and comprising a plurality of openings therethrough; a diffuser mounted on the illumination source side of the aperture layer; a projection lens system; and an image plane, in which a pupil image corresponding to each of the plurality of openings in the aperture layer is formed at the image plane when radiation from the illumination source passes through the reticle, the diffuser, the aperture layer and the projection lens system, the pupil image having a projection lens pupil transmission distribution.

20 Claims, 7 Drawing Sheets

METHOD AND DEVICE FOR DETERMINING PROJECTION LENS PUPIL TRANSMISSION DISTRIBUTION AND ILLUMINATION INTENSITY DISTRIBUTION IN PHOTOLITHOGRAPHIC IMAGING SYSTEM

BACKGROUND OF THE INVENTION

1. Technical Field

The present invention relates to photolithographic lens systems and, more specifically, to a method and apparatus for determining projection lens transmission distribution while separating contributions of the illumination source aperture uniformity from the projection lens pupil transmission distribution in a photolithographic lens system.

2. Background Art

Optical photolithography has been widely used in the semiconductor industry in connection with the formation of a wide range of structures in integrated circuit (IC) chips. Complex forms of pupil illumination patterns have become increasingly common for the purpose of improving resolution or depth of focus. The ability to measure and verify the correct distribution of illumination in the pupil plane has become increasingly critical.

Uniformity of the illumination at the wafer surface is needed so that the same exposure of photoresist or other light sensitive films is consistently achieved across the entire exposure field. The degree of partial incoherency of the illumination, or more generally the distribution of pupil illumination, must also be constant across the entire exposure field. As tolerances of the printed lithographic patterns become increasingly tight, the requirement that the pupil illumination distribution not vary across the exposure field becomes increasingly important.

Various illumination systems for lithographic lenses have been developed, including those that create complex patterns of pupil illumination to enhance lithographic resolution and/or depth of focus. Illumination patterns, such as dipole, quadrupole, and annular shapes, have been developed to improve the resolution and depth of focus of the image formation. Some of these illumination patterns are particularly suited to enhancing the lithographic performance of specific mask patterns that are exposed on the stepper. When conventional partially coherent illumination is used, the center of the pupil is illuminated uniformly out to a prescribed fraction of the pupil size. In the case of both conventional partially coherent illumination and the more complex off-axis illumination patterns, the consistency of the illumination pattern at every position in the exposure field is critical.

As dimensions of IC components are continually reduced, and as the wavelength of light used in photolithography is reduced, it becomes increasingly important to be able to determine the sources of non-uniformity in illumination at the wafer plane. As the lens systems used for photolithography become more complex, it becomes more important to be able to isolate portions of the systems in seeking to determine such sources of non-uniformity.

The quality and uniformity of the illumination at the wafer plane can be analyzed and characterized by a variety of techniques, including wafer-plane power meters, analysis of photoresist or other light-sensitive films, etc. In the past, the pupil illumination has been measured by using either a single, relatively large (one to a few millimeters), aperture in the plane of the photomask, or a plurality of pinholes in an array. In both cases, the aperture functions as a pinhole camera and projects a geometrical image of the pupil illumination pattern.

However, in the past it has not been possible to separate contributions to non-uniformity originating in the illumination source from contributions to non-uniformity originating in the projection lens system.

Therefore, a need exists for a system that can efficiently obtain quantitative measurements of the illumination pattern at the wafer plane of the photolithographic lens system, while separating contributions to non-uniformity originating in the illumination source from contributions to non-uniformity originating in the projection lens system.

SUMMARY OF THE INVENTION

In one embodiment, the present invention relates to a device for determining projection lens pupil transmission distribution in a photolithographic imaging system, the device including an illumination source; a transmissive reticle; an aperture layer having an illumination source side and a light emission side and comprising a plurality of openings therethrough; a diffuser mounted on the illumination source side of the aperture layer; a projection lens system; and an image plane, in which a pupil image corresponding to each of the plurality of openings in the aperture layer is formed at the image plane when radiation from the illumination source passes through the reticle, the diffuser, the aperture layer and the projection lens system, the pupil image having a projection lens pupil transmission distribution.

In another embodiment, the present invention relates to a method for determining projection lens pupil transmission distribution and illumination source aperture uniformity in a photolithographic imaging system, including (a) providing a photolithographic imaging system which includes an illumination source; a transmissive reticle; an aperture layer having an illumination source side and a light emission side and comprising a plurality of openings therethrough; and a projection lens system; (b) measuring first pupil intensity distribution of images formed by the openings in the aperture layer at an image plane while passing radiation from the illumination source through the reticle, the pinhole plate and the projection lens system; (c) mounting a diffuser on the illumination source side of the aperture layer; (d) measuring second pupil intensity distribution of pupil images formed at the image plane by the openings in the aperture layer while passing radiation from the illumination source through the reticle, the diffuser, the aperture layer plate and the projection lens system; and (e) comparing the first and the second pupil intensity distributions to determine intensity distribution of radiation emanating from the illumination source and the projection lens system.

In another embodiment, the present invention relates to a device for determining both illumination source aperture uniformity and projection lens pupil transmission distribution in a photolithographic imaging system, the device including: an illumination source; a transmissive reticle; an aperture layer having an illumination source side and a light emission side and comprising a plurality of openings therethrough; a diffuser removably mounted on the illumination source side of the aperture layer; a projection lens system; and an image plane, in which a first pupil image corresponding to each of the plurality of openings in the aperture layer is formed at the image plane when the diffuser is removed and radiation from the illumination source passes through the reticle, the aperture layer and the projection lens system, the first pupil image having a first pupil intensity distribution $P_{(x,y)\ no\ diffuser}$; and a second pupil image corresponding to each of the plurality of openings in the aperture layer is formed at the image plane when the diffuser is mounted and radiation from the illumination source passes through the reticle, the diffuser, the aperture layer and the projection lens system, the second pupil image having a second pupil intensity distribution $P_{(x,y)\ diffuser}$, and the following relationships are defined:

$$P_{(x,y)\ diffuser} \cong P_{(x,y)\ projection\ lens} \qquad (1)$$

and $$P_{(x,y)\ diffuser}/P_{(x,y)\ no\ diffuser} \cong P_{(x,y)\ illumination\ source} \qquad (2).$$

In one embodiment, the diffuser randomizes or homogenizes one or more of the intensity, spatial intensity distribution, phase, coherence and propagation direction of the radiation passing therethrough. In one embodiment, the diffuser eliminates, substantially alters and/or decouples contributions to the pupil image arising from the illumination source aperture uniformity from the projection lens pupil transmission distribution. As a result of using the diffuser, it is possible to better identify sources of non-uniformity in images formed at the wafer in a photolithographic lens system.

Thus, the present invention provides a system that can efficiently obtain quantitative measurements of the illumination pattern at the wafer plane of the photolithographic lens system, while separating contributions to non-uniformity originating in the illumination source from contributions to non-uniformity originating in the projection lens system.

It should be appreciated that for simplicity and clarity of illustration, elements shown in the Figures have not necessarily been drawn to scale. For example, the dimensions of some of the elements may be exaggerated relative to each other for clarity. Further, where considered appropriate, reference numerals have been repeated among the Figures to indicate corresponding elements.

It should be appreciated that the process steps and structures described below do not form a complete process flow for operating a photolithographic imaging system or for constructing a complete photolithographic imaging device. The present invention can be practiced in conjunction with evaluation techniques, processing methods and fabrication techniques currently used in the art, and only so much of the commonly practiced process steps and known devices and systems are included as are necessary for an understanding of the present invention.

DETAILED DESCRIPTION OF THE INVENTION

The present invention relates to device elements and a method of using those elements that may be used in conjunction with virtually any conventional or non-conventional photo lithographic lens system. A number of embodiments of a device in accordance with the present invention can be assembled as shown in FIGS. 1–12. FIGS. 1–4 are schematic diagrams depicting the photolithographic lens system of several embodiments of a device 100, 200, 300 and 400, respectively, for determining projection lens pupil transmission distribution in accordance with the present invention. FIGS. 5–12 are schematic diagrams depicting portions of the system in accordance with various embodiments of the present invention.

In each of FIGS. 1–4, there is an illumination source 102 which directs its light or other electromagnetic radiation of appropriate wavelength substantially in the direction of arrow 104. As used herein, the term "light" generally refers to such light or other electromagnetic radiation of appropriate wavelength. For example, the term light as used herein may refer to radiation having wavelengths such as 248 nm, 193 nm, 157 nm or other wavelengths used with transmission (refractive) optics, reflective (cataoptric) optics or combinations of refractive and reflective (catadioptric) optics.

Various optical elements 106 indicated generally by a bracket may be included in the devices 100, 200, 300 and 400. Since there may be any of a wide variety of optical elements 106 used in this portion of the devices, specific, separate embodiments are not shown in FIGS. 1–4. These optical elements 106 may include elements such as an aperture stop, a condenser lens, one or more off-axis openings such as a dipole, quadrupole or annular pattern, or any other suitable pattern, which directs and shapes the light onto the elements described in the following, and other optical elements known in the art. The present invention is not limited to any particular set of optical elements 106.

In one embodiment, light emanating from the optical elements 106 encounters a reticle 108, an aperture layer 110 and a diffuser or homogenizer 112 (referred to hereinafter as a diffuser). The order of these structures may vary, with the proviso in this embodiment that the diffuser 112, when present, is always between the aperture layer 110 and the optical elements 106 or the illumination source 102. That is, in this embodiment, light reaching the aperture layer 110 has passed through the diffuser/homogenizer 112. As will be described in more detail below, the diffuser 112 is removable and is removed from the device during a portion of a method of using the device 100, 200, 300 or 400 such as those described here. FIGS. 1–4 show several of the possible arrangements of the reticle 108, the aperture layer 110 and the diffuser 112, together with other elements which may be present in particular embodiments. Each of the embodiments shown in FIGS. 1–4, and variations thereof, are discussed in some detail below. As noted above, FIGS. 5–12 depict a number of variations of arrangements of the reticle 108 and/or the aperture layer 110 and/or the diffuser 112, which may be used in devices such as those shown in FIGS. 1–4.

As shown in FIGS. 1–4, the aperture layer 110 includes a plurality of openings or pinholes 114. The plurality of pinholes 114 may be arranged in an array in the aperture layer 110 (See, e.g., FIGS. 5–7). The array may be regular or irregular, and may cover portions only or substantially the entire area of the aperture layer 110. The pinholes 114 may be of suitable size, selected based upon factors such as the design rule of devices to be fabricated with the photolithographic imaging system, the wavelength of radiation used, and other related or unrelated factors known by those of ordinary skill in the art. In one embodiment, the pinholes 114 have openings with a substantially same predetermined size and shape. In one embodiment, the pinholes 114 are spaced apart from one another so that overlap between the pupil images at the image plane is avoided while measuring intensity and/or uniformity of the projection lens pupil images is enabled. This feature is described in more detail below.

Figure 5:
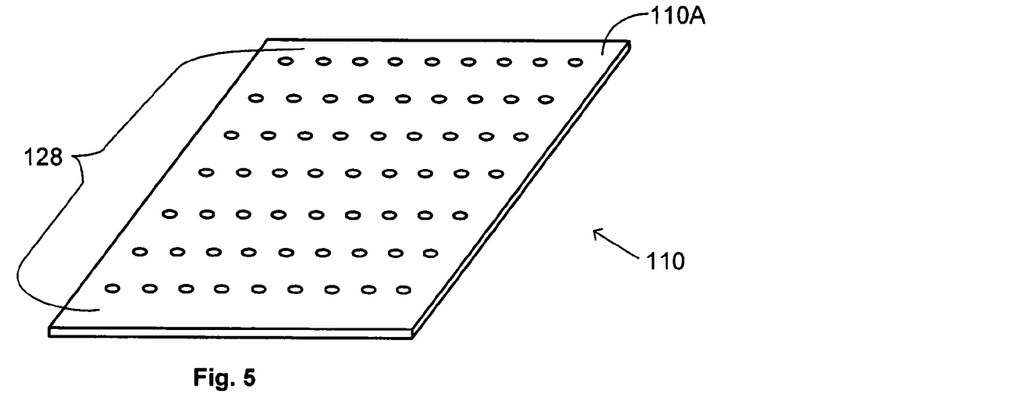
FIGS. 5 and 6 are schematic drawings depicting embodiments of exemplary aperture layers in accordance with the present invention.

The aperture layer 110 may be formed in a variety of different ways. In one embodiment, the aperture layer 110 is a separate plate, which may be referred to as an aperture plate 110 or a pinhole plate 110. An exemplary aperture plate 110 is shown in FIG. 5.

As shown in FIGS. 1–4, light 116 which has passed through the reticle 108, the aperture layer 110 and the diffuser 112 passes to a projection lens 118. The projection lens 118, as will be understood, may include a plurality of lenses, which may be either or both transmissive and reflective. The exact contents and arrangement of such transmissive and/or reflective elements in the projection lens 118 may be suitably selected by those of ordinary skill in the art.

As shown in FIGS. 1–4, after the light 116 passes into the projection lens 118, the light is emitted therefrom as light 120. The light 120 is focused on a focal plane 122. The light 120 forms a plurality of pupil images 124 corresponding to the pinholes 114 at a pupil image plane 126. In some embodiments, the pupil image plane 126 is coplanar with the focal plane 122, while in other embodiments, the pupil image plane 126 is non-coplanar with the focal plane 122. These embodiments are discussed in more detail with respect to specific embodiments shown in FIGS. 1–4.

In one embodiment, the reticle 108 has no substantial effect on the radiation passing therethrough, acting substantially only as a structural support member. In one embodiment, the reticle 108 acts solely as a structural support member. In one embodiment, the reticle 108 includes a simple frame upon which elements such as the aperture layer 110 and/or the diffuser 112 may be mounted. Thus, in such an embodiment, the reticle 108 substantially constitutes a support structure. In one embodiment, the reticle 108 acts as a substrate upon which the aperture layer 110 is formed. In one embodiment, the reticle 108 acts as a substrate upon which both the aperture layer 110 and the diffuser 112 are formed or placed. In one embodiment, the reticle 108 acts as a substrate upon which the diffuser 112 is placed. Specific embodiments in which either or both the aperture layer 110 and the diffuser 112 are formed on or attached to the reticle 108 are described below with reference to specific exemplary embodiments of the device. In one embodiment, the reticle is substantially transparent to the light or radiation passing through it. Additional details relating to structure of the reticle 108 and other elements placed or formed on it are provided below.

Figure 1:
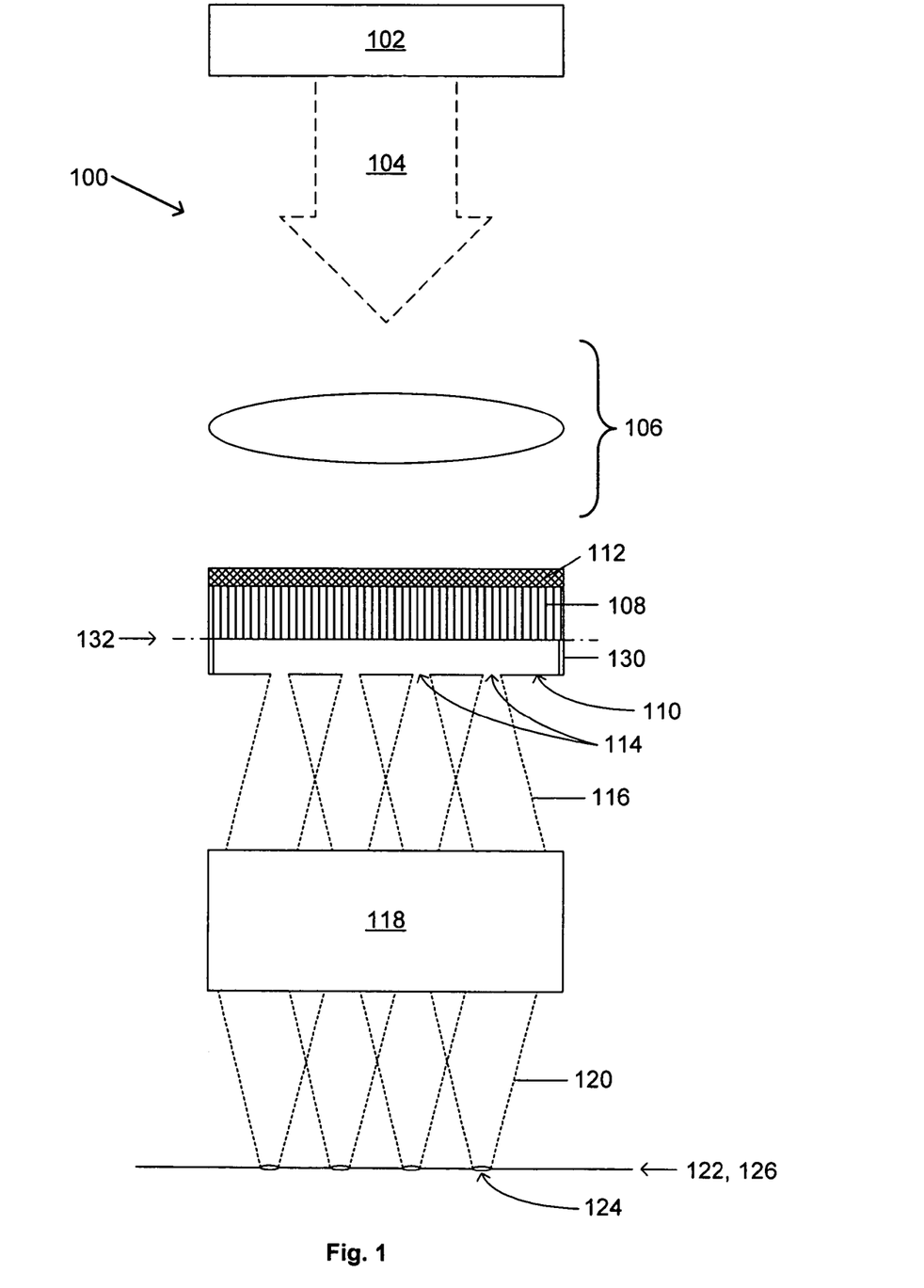
FIGS. 1–4 are schematic diagrams depicting the photolithographic lens system of several embodiments of a device for determining projection lens pupil transmission distribution in accordance with the present invention.

The aperture layer 110 of the present invention may comprise a number of possible structures or forms. In one embodiment, the aperture layer 110 comprises a separate structure, such as the aperture plate 110. An embodiment of the aperture layer 110 which comprises a pinhole plate is schematically depicted in FIG. 5. FIG. 5 shows a pinhole plate 110A in which an array 128 of the apertures or pinholes 114 are formed. As noted above, the embodiment of the array 128 of apertures or pinholes 114 shown in FIG. 1 is a regular array, including a large number of apertures 114 arrayed over substantially the entire surface of the pinhole plate 110A. In other embodiments, the array 128 may be irregular and may cover substantially less than the entire surface of the pinhole plate 110A, or only a small fraction of the surface thereof. It is noted that the thickness of the pinhole plate 110 may be exaggerated in FIG. 5 relative to the actual thickness of such a plate.

Figure 6:
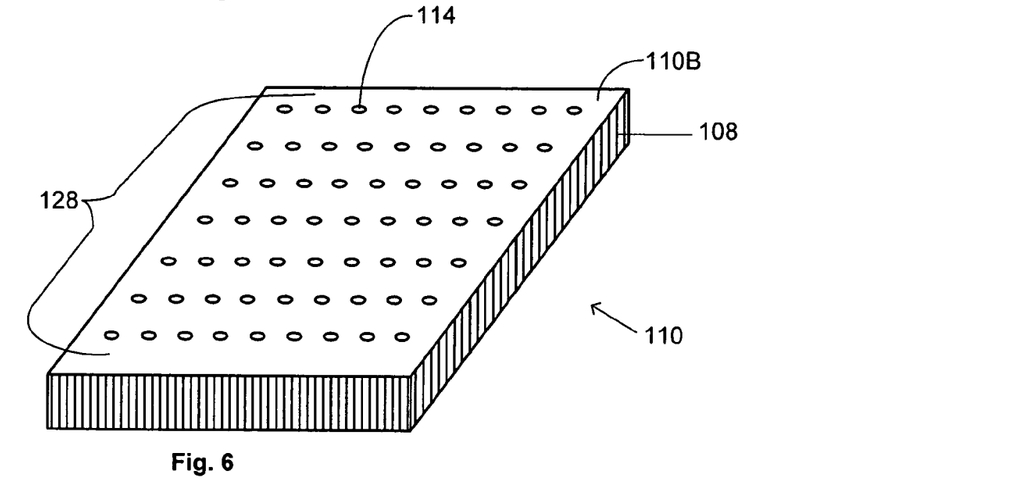

In another embodiment, the aperture layer 110 comprises a thin layer of light-blocking or light-absorbing material formed on either the upper or lower surface of the reticle 108 with a plurality of apertures or pinholes 114 etched or otherwise formed therein. An embodiment of the aperture layer 110 which comprises a thin layer 110B of light-blocking or light-absorbing material formed on the upper surface of a reticle 108 is schematically depicted in FIG. 6. FIG. 6 shows a thin layer 110B of a light-blocking or light-absorbing material formed or deposited on the upper surface of a reticle 108. The light-blocking or light-absorbing material may be a material such as chrome, which is conventionally used in forming masks in photolithography. Any suitable light-blocking or light-absorbing material may be used for this embodiment. The material of the layer 110B may be deposited and then etched to form the apertures or pinholes 114, which are shown in an array 128 similar to that of FIG. 5.

The diffuser or homogenizer 112 of the present invention may comprise any of a variety of different devices for diffusing and/or homogenizing light impinging thereon. The diffuser 112, in one embodiment, comprises a material such as a glass, silicon dioxide, calcium fluoride, magnesium fluoride or other materials known for transmitting light. As will be understood, as the wavelengths of the light 104 produced by the illumination source 102 become shorter, use of materials which transmit shortwavelength radiation, such as the aforementioned calcium or magnesium fluoride, need to be used. The exact material may be suitably selected by those of ordinary skill in the art based on wavelength, etc. The diffuser 112 includes elements or structures which diffuse or homogenize the light passing through it.

In one embodiment, light passing through the diffuser sustains at least some degree of homogenization or randomization of one or more of intensity, spatial intensity distribution, phase, coherence and propagation direction of the light. Thus, in one embodiment, a diffuser is any device which causes at least some degree of homogenization and/or randomization of one or more of these properties of light from an illumination source. Other devices which may act to diffuse light from an illumination source such as that described herein include, for example, a pinhole or aperture which is oscillated perpendicular to the direction of propagation of the light. Such pinhole or aperture could be in the form of a wire mesh, and in one embodiment, a random wire mesh, which is oscillated perpendicular to the direction of propagation of the light. A reflective/scattering plate, which also can be oscillated, may also function to homogenize and/or randomize light passing through the device. The terms diffusion, homogenization, randomization and blurring are all intended to describe or identify the effect of the diffuser upon light passing therethrough. These terms may be used interchangeably. The purpose of the diffuser is to remove information, in any form (such as those exemplified above), from the light emanating from the illumination source, so that the light is uniform.

The diffuser 112 may include structure such as internal crystal deformations, a roughened or frosted outer surface, or other known features which diffuse and/or homogenize the light or radiation passing therethrough.

In other embodiments, the diffuser may have other structures, such as a fly's eye lens; internal metallic and/or reflective random meshes through which light is passed; reflective rods (multiple internal reflections also redistribute the light); and random-phase plates.

In one embodiment, transmissive optics may be fabricated from quartz (also called fused silica or $SiO_2$) for 248 nm and 193 nm wavelengths. In another embodiment, the optics may be fabricated from fluorinated (modified) fused silica ($SiO_2$) for 157 nm (also for 248 nm and 193 nm) wavelengths. In another embodiment, the optics may be fabricated from $CaF_2$ crystal for 157 nm (also for 248 nm and 193 nm) and some shorter wavelengths. Any of these optics can be coated appropriately for durability, angular reflectivity, transmission, etc., as known in the art.

In general, the main physical approaches to diffusion for this purpose are scattering (rough surfaces, bulk material non-homogeneity) which can be used with reflective or transmissive optics, multiple internal reflections (in devices such as quartz rods), useful with transmissive optics, and oscillating reflective and transmissive elements (which homogenize the light by averaging), which can be used with reflective or transmissive optics. The diffuser should have high efficiency in scattering the light forward (i.e., in the direction of transmission and not backscattering), and should have a good transmission (i.e., low in absorption). Increasing transmission provides more light at the image plane, thus avoiding extended exposure times and obtaining a good signal-to-noise ratio. The diffuser should destroy (or scramble) as much spatial structure (intensity and phase) of the light within the illumination pupil as possible. Suitable diffusive optics can be selected as appropriate to the wavelength and optics with which the diffuser is to be used.

Referring now to FIGS. 1–4, specific exemplary embodiments of the invention will be disclosed in the following.

Referring first to FIG. 1, there is shown an embodiment of a device 100 for determining illumination intensity distribution and projection lens pupil transmission distribution in a photolithographic imaging system. As noted, the device 100 includes parts of a photolithographic imaging system, but only so much of it as is needed to illustrate the present invention.

The device 100 includes an embodiment of the present invention in which the diffuser 112 is placed on the upper surface of the reticle 108. The upper surface of the reticle 108 may also be referred to as the illumination source side of the reticle 108. In one embodiment (similar to that shown in FIG. 4) the diffuser 112 may be mounted upon the upper surface of the reticle 108 by a support frame, similar to a pellicle frame or to a frame for supporting a pinhole plate as described below. The diffuser 112 in this embodiment may be any of the diffusers or homogenizers described herein.

Referring still to FIG. 1, there is shown an aperture layer 110 mounted upon an aperture frame 130. In this embodiment, mounting the aperture layer 110 on the aperture frame 130 moves the plane defined by the aperture layer 110 below a first focal plane 132. The first focal plane 132 may also be referred to as an object plane. Since, in this embodiment, the apertures 114 are located at a position other than at the object plane or first focal plane 132, the pupil image 124, and the pupil image plane 126, are located at the focal plane 122.

As shown in FIG. 1, light 116 exiting the aperture layer 110 enters the projection lens 118. As noted, the projection lens 118 may and generally does comprise a plurality of lenses which may be either or both transmissive and/or reflective. The projection lens 118 functions in a manner generally known in the art for such lenses. In this embodiment, light 120 exiting the projection lens 118 is focused upon the focal plane 122, and forms the pupil images 124 at the image plane 126. In the embodiment depicted in FIG. 1, the focal plane 122 is substantially coplanar with the image plane 126.

Figure 7:
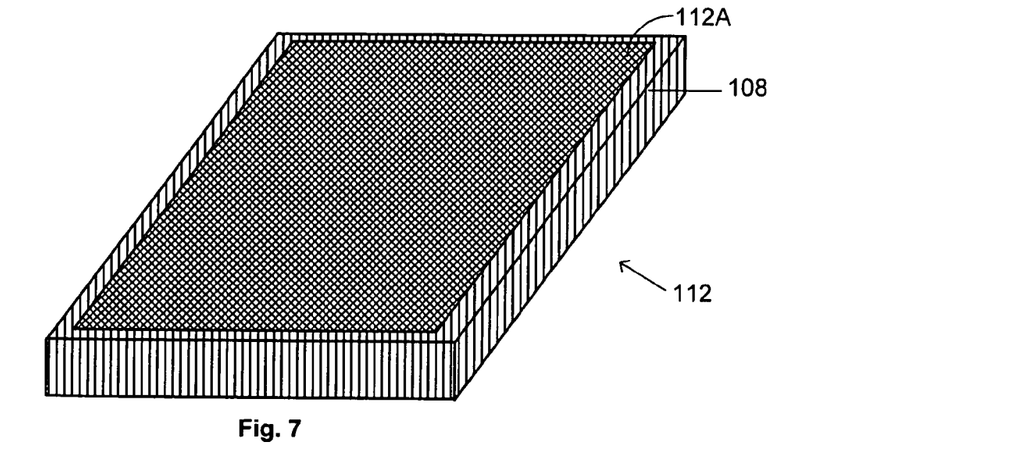
FIG. 7 is a schematic drawing depicting an embodiment of a diffuser disposed in and supported by a reticle in accordance with the present invention.

In other embodiments, not shown but similar to the embodiment shown in FIG. 1, the diffuser 112 may be disposed within the reticle 108, in which case the reticle acts as a support structure or frame for holding the diffuser 112 at its selected location. An embodiment showing a diffuser 112 disposed within a reticle 108 is schematically shown in FIG. 7.

In accordance with a method described in more detail below, by use of the device 100 depicted in FIG. 1, the intensity distribution and uniformity of light forming the pupil images 124 may be measured both with and without the diffuser 112 in place. The data obtained from such measurements may be used to determine both the illumination source aperture uniformity and the projection lens pupil transmission distribution, and allows for separation of the illumination source aperture uniformity when the projection lens pupil transmission distribution is being determined.

Figure 2:
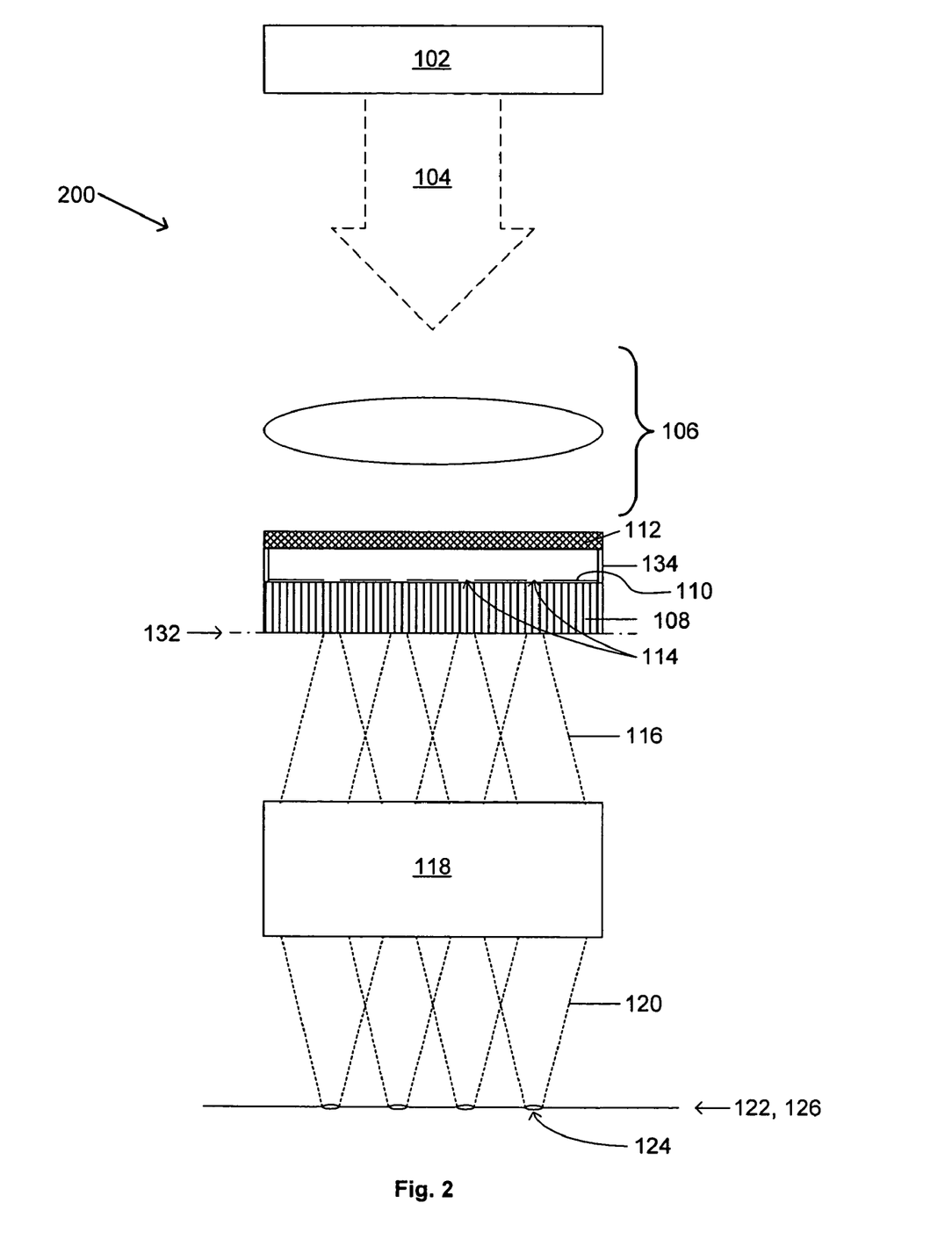

Referring now to FIG. 2, there is shown a second embodiment of the present invention, specifically a device 200 for determining illumination intensity distribution and projection lens pupil transmission distribution in a photolithographic imaging system. As noted, the device 200 includes parts of a photolithographic imaging system, but only so much of it as is needed to illustrate the present invention. In describing the embodiment shown in FIG. 2, similar structural elements have been assigned the same reference numbers as in the embodiment shown in FIG. 1, and only so much of the description is repeated as is needed to describe the embodiment of FIG. 2 and how it differs from the embodiment of FIG. 1.

Similar to the embodiment of FIG. 1, in the embodiment of FIG. 2, light 104 from the illumination source 102 passes through and may be suitably modified by the optical elements 106.

As shown in FIG. 2, in this embodiment, light exiting the optical elements 106 first encounters a diffuser or homogenizer 112, then passes through an aperture layer 110, and thence through a reticle 108. In this embodiment, the object plane or focal plane 132 is at the lower side of the reticle 108.

In the embodiment shown in FIG. 2, the diffuser 112 is mounted upon a diffuser frame 134. The diffuser frame 134, as shown in FIG. 2, elevates the diffuser 112 above the aperture layer 110. In this embodiment, the aperture layer 110 is formed or deposited on or over the upper surface of the reticle 108.

Figure 8:
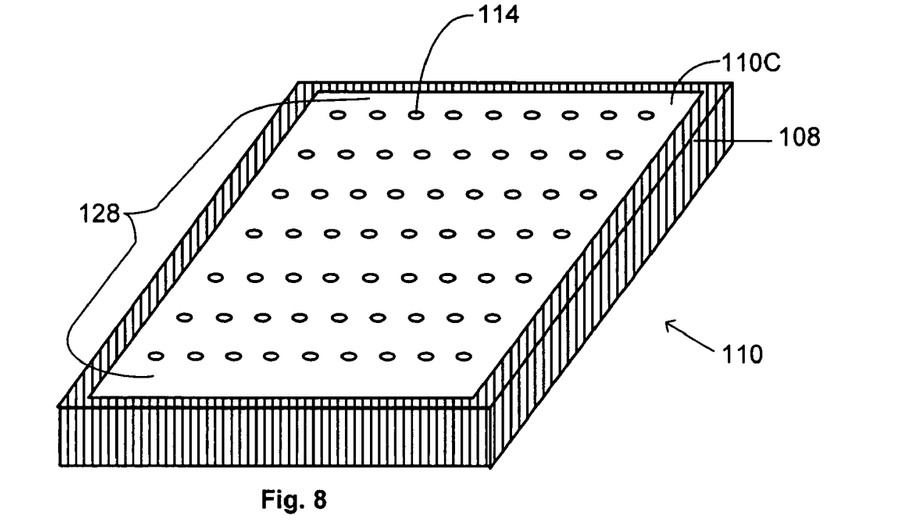
FIG. 8 is a schematic drawing depicting an embodiment of an aperture layer supported by a reticle in accordance with the present invention.

In other embodiments similar to the embodiment shown in FIG. 2, the aperture layer 110 may be present in the form of an aperture plate, and this aperture plate may be either disposed on or over the upper surface of the reticle 108, disposed on its own frame as in FIG. 1, or disposed within the reticle 108, in which case the reticle acts as a support structure or frame for holding the aperture layer 110 at its selected location. An embodiment in which an aperture layer or plate 110C is disposed within the reticle 108 is schematically illustrated in FIG. 8. Although not shown, the aperture layer or plate 110C may be disposed at a level below the plane defined by the upper edges of the frame formed by the reticle 108 shown in FIG. 8.

As shown in FIG. 2, light 116 exiting the reticle 108 passes into the projection lens 118. Light 120 exiting the projection lens 118 is focused upon a focal plane 122, and forms pupil images 124 at an image plane 126. In the embodiment depicted in FIG. 2, the focal plane 122 is substantially coplanar with the image plane 126.

In accordance with a method described in more detail below, by use of the device 200 depicted in FIG. 2, the intensity distribution and uniformity of light forming the pupil images 124 may be measured both with and without the diffuser 112 in place. The data obtained from such measurements may be used to determine both the illumination source aperture uniformity and the projection lens pupil transmission distribution, and allows for separation of the illumination source aperture uniformity when the projection lens pupil transmission distribution is being determined.

Figure 3:
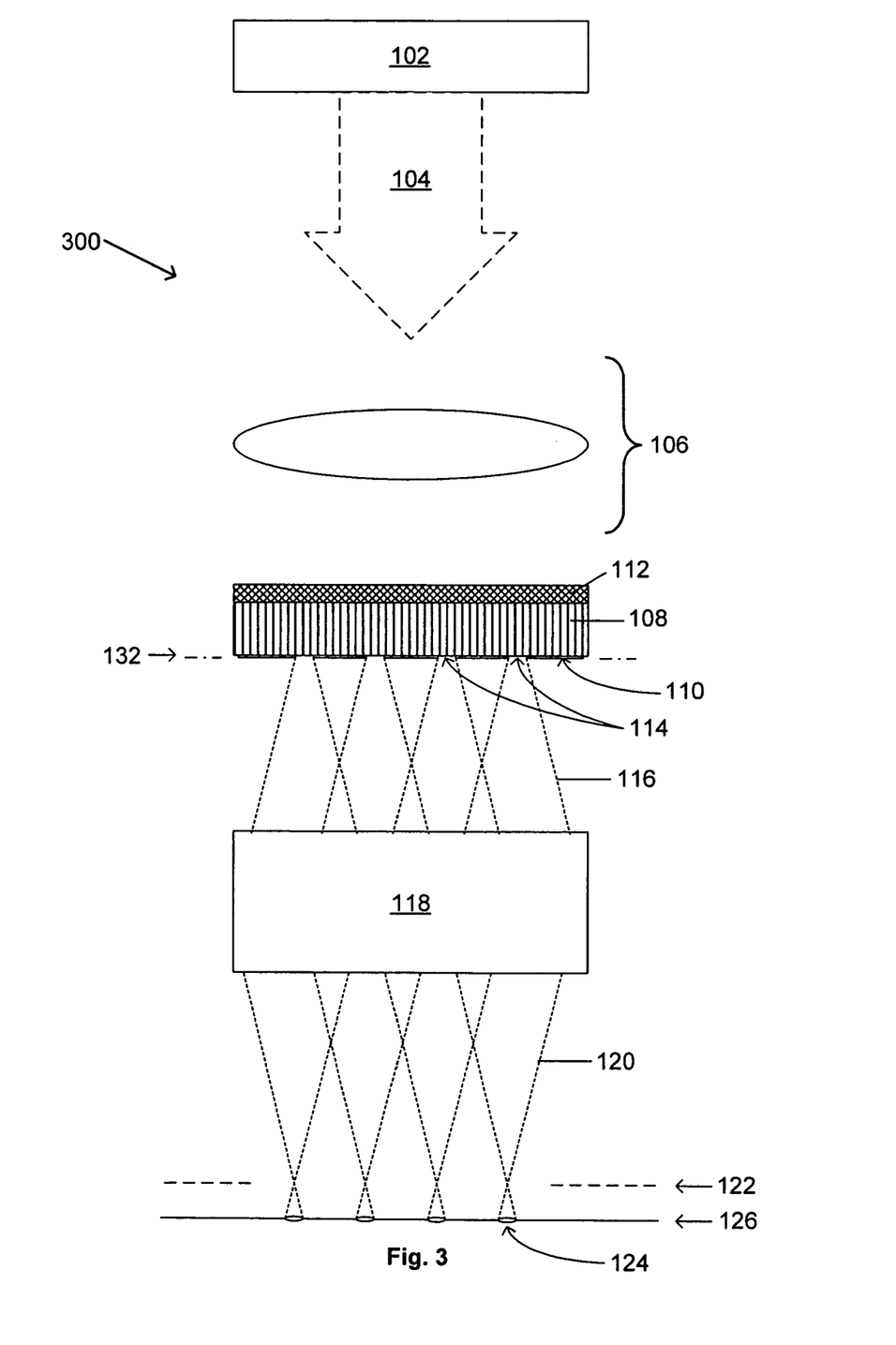

Referring now to FIG. 3, there is shown a third embodiment of the present invention, specifically a device 300 for determining illumination intensity distribution and projection lens pupil transmission distribution in a photolithographic imaging system. As noted, the device 300 includes parts of a photolithographic imaging system, but only so much of it as is needed to illustrate the present invention. In describing the embodiment shown in FIG. 3, similar structural elements have been assigned the same reference numbers as in the embodiments shown in FIGS. 1 and 2, and only so much of the description is repeated as is needed to describe the embodiment of FIG. 3 and how it differs from the embodiments of FIGS. 1 and 2.

Similar to the embodiments of FIGS. 1 and 2, in the embodiment of FIG. 3, light 104 from the illumination source 102 passes through and may be suitably modified by the optical elements 106.

As shown in FIG. 3, in this embodiment, light exiting the optical elements 106 first encounters a diffuser or homogenizer 112, then passes through a reticle 108, and thence through an aperture layer 110. In this embodiment, the object plane or focal plane 132 is just below the lower side of the reticle 108, and is substantially coplanar with the aperture layer 110.

In other embodiments similar to the embodiments shown in FIGS. 1 and 3, the diffuser 112 may be disposed within the reticle 108, in which case the reticle acts as a support structure or frame for holding the diffuser 112 at its selected location. An embodiment showing a diffuser 112A disposed within a reticle 108 is schematically shown in FIG. 7.

In other embodiments similar to that shown in FIG. 3, the aperture layer 110 may be present in the form of an aperture plate, and this aperture plate may be either disposed within the reticle 108, in which case the reticle acts as a support structure or frame for holding the aperture layer 110 at its selected location. An embodiment in which an aperture layer or plate 110 is disposed within the reticle 108 is schematically illustrated in FIG. 8, which with respect to this embodiment would be a lower perspective view of the reticle 108 with the aperture plate 110C disposed therein. Although not shown, the aperture layer or plate 110C may be disposed at a level below the plane defined by the lower edges of the frame formed by the reticle 108 shown in FIG. 8.

As shown in FIG. 3, light 116 exiting the reticle 108 passes into the projection lens 118. Light 120 exiting the projection lens 118 is focused upon a focal plane 122, and forms pupil images 124 at an image plane 126. In the embodiment depicted in FIG. 3, the focal plane 122 is in a plane which is at a non-coplanar position with respect to the image plane 126. Thus, in this embodiment, the pupil images 124 are formed at a defocused position (the image plane 126), somewhat removed from the focal plane 122.

In accordance with a method described in more detail below, by use of the device 300 depicted in FIG. 3, the intensity distribution and uniformity of light forming the pupil images 124 may be measured both with and without the diffuser 112 in place. The data obtained from such measurements may be used to determine both the illumination source aperture uniformity and the projection lens pupil transmission distribution, and allows for separation of the illumination source aperture uniformity when the projection lens pupil transmission distribution is being determined.

Figure 4:
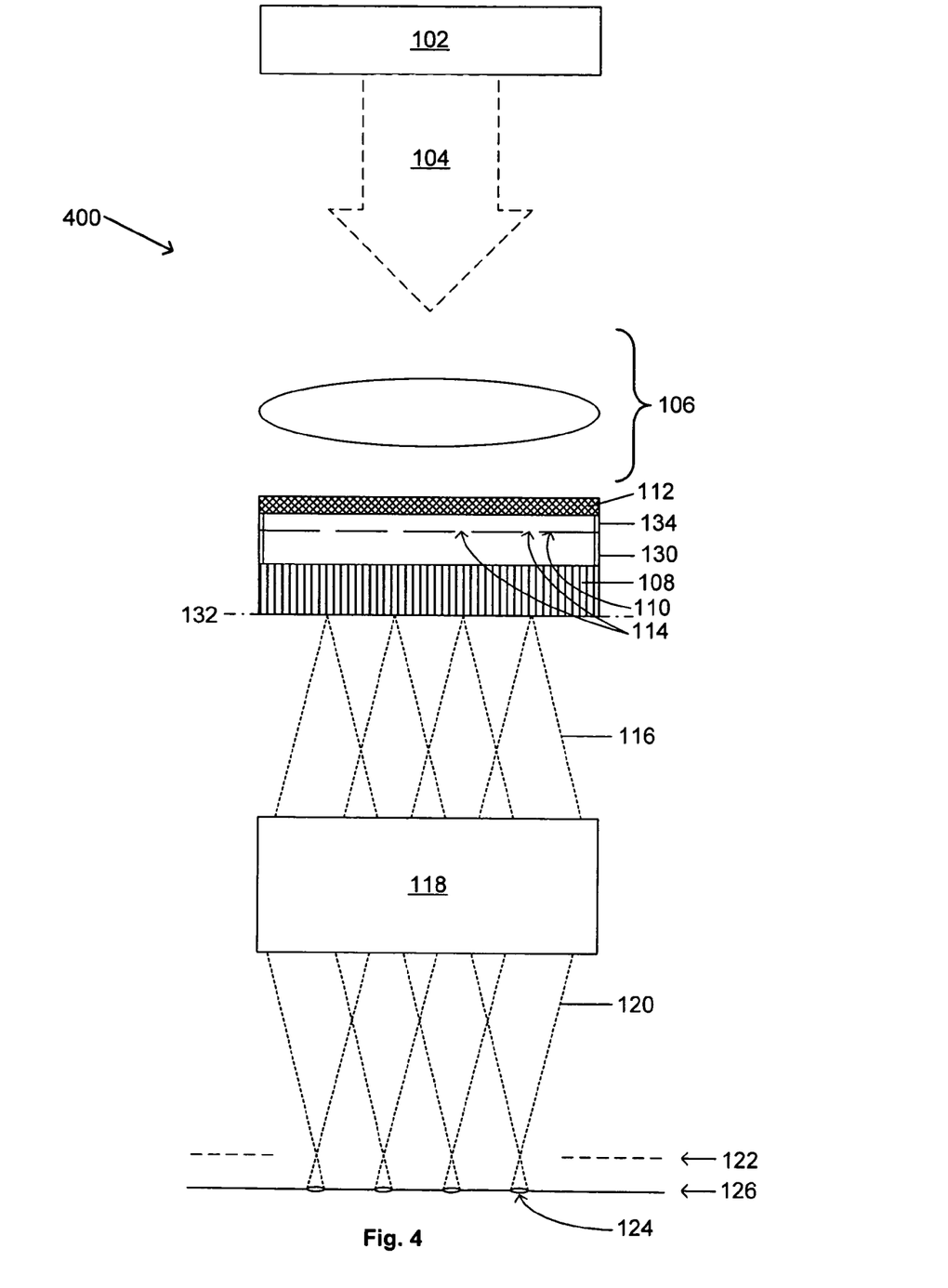

Referring now to FIG. 4, there is shown a fourth embodiment of the present invention, specifically a device 400 for determining illumination intensity distribution and projection lens pupil transmission distribution in a photolithographic imaging system. As noted, the device 400 includes parts of a photolithographic imaging system, but only so much of it as is needed to illustrate the present invention. In describing the embodiment shown in FIG. 4, similar structural elements have been assigned the same reference numbers as in the embodiments shown in FIGS. 1–3, and only so much of the description is repeated as is needed to describe the embodiment of FIG. 4 and how it differs from the embodiments of FIGS. 1–3.

Similar to the embodiment of FIGS. 1–3, in the embodiment of FIG. 4, light 104 from the illumination source 102 passes through and may be suitably modified by the optical elements 106.

As shown in FIG. 4, in this embodiment, light exiting the optical elements 106 first encounters a diffuser or homogenizer 112, then passes through an aperture layer 110, and thence through a reticle 108. In this embodiment, the object plane or focal plane 132 is at the lower side of the reticle 108.

In the embodiment shown in FIG. 4, the diffuser 112 is mounted upon a diffuser frame 134. The diffuser 112 and the diffuser frame 134 are in turn mounted on an aperture frame 130, and an aperture layer 110 is also mounted on the aperture frame 130. The diffuser frame 134, as shown in FIG. 4, elevates the diffuser 112 above the aperture layer 110. Similarly, the aperture frame 130 elevates both the aperture layer 110, the diffuser frame 134 and the diffuser 112 above the reticle 108.

Figure 9:
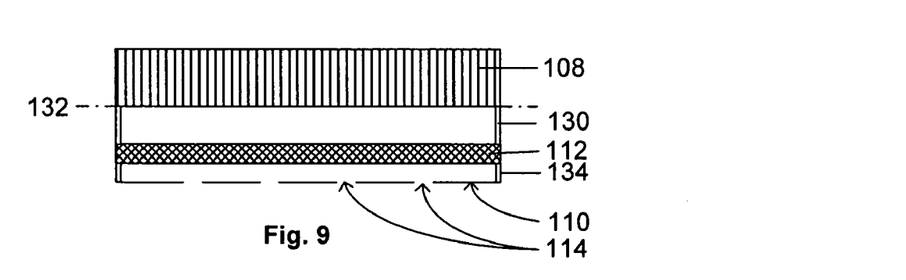
FIGS. 9–11 depict several alternate embodiments of reticle, aperture layer and diffuser in accordance with the present invention.
Figure 10:
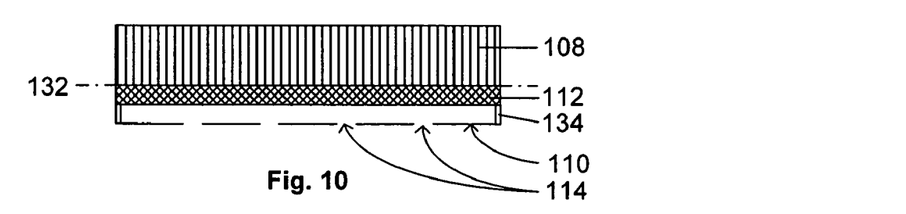

In other embodiments similar to the embodiment shown in FIG. 4, the diffuser 112, the diffuser frame 134, the aperture layer 110 and the aperture frame 130 may be placed below the reticle 108, as shown in FIG. 9. In another embodiment, the diffuser frame 134 may be omitted, in which case the diffuser 112 is disposed on or just below the lower surface of the reticle 108, as shown in FIG. 10. Similarly, in another embodiment (not shown) the diffuser frame 134 may be retained and the aperture frame 130 omitted. In other embodiments similar to that shown in FIG. 9, both the diffuser frame 134 and the aperture frame 130 may be omitted, as shown FIG. 11.

Figure 11:
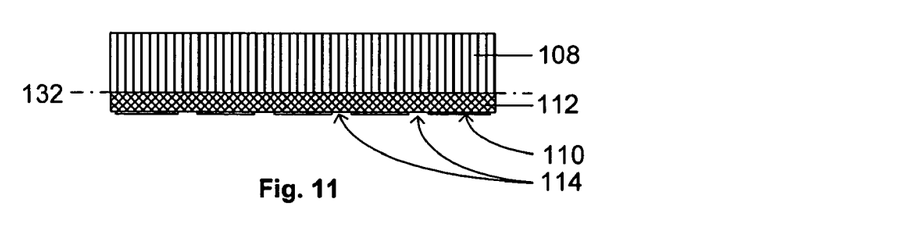
Figure 12:
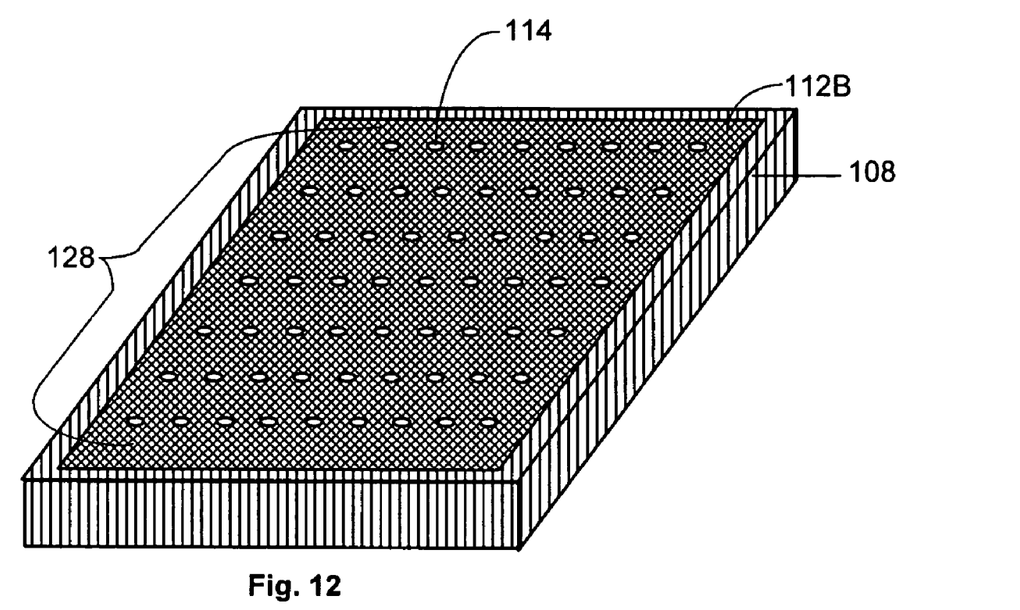
FIG. 12 is a schematic drawing depicting an embodiment of both an aperture layer and a diffuser supported by a reticle in accordance with the present invention.

Similarly to the embodiments shown in FIGS. 7 and 8, in other embodiments similar to that shown in FIG. 11, the diffuser 112 may be embedded in or supported by the lower surface of the reticle 108, with the aperture layer 110 either formed on or over the lower surface of the diffuser 112 and the reticle 108. In another embodiment, both the diffuser 112 and the aperture layer 110 may be embedded in and supported by the reticle. This embodiment would have an appearance similar to a lower perspective view of a combination of FIGS. 7 and 8, which is shown in FIG. 12.

Referring again to FIG. 4, light 116 exiting the reticle 108 passes into the projection lens 118. Light 120 exiting the projection lens 118 is focused upon a focal plane 122, and forms pupil images 124 at an image plane 126. In the embodiment depicted in FIG. 4, as in FIG. 3, the focal plane 122 is in a plane which is at a non-coplanar position with respect to the image plane 126. Thus, in this embodiment, the pupil images 124 are formed at a defocused position (the image plane 126), somewhat removed from the focal plane 122.

In accordance with a method described in more detail below, by use of the device 400 depicted in FIG. 4, the intensity distribution and uniformity of light forming the pupil images 124 may be measured both with and without the diffuser 112 in place. The data obtained from such measurements may be used to determine both the illumination source aperture uniformity and the projection lens pupil transmission distribution, and allows for separation of the illumination source aperture uniformity when the projection lens pupil transmission distribution is being determined.

As noted above, in each embodiment depicted in FIGS. 1–12, the diffuser 112 is disposed between the aperture layer 110 and the illumination source 102. This feature allows use of the diffuser 112 to remove effects from the illumination source aperture uniformity or non-uniformity from the determination of the projection lens pupil transmission distribution. Use of the apparatus 100, 200, 300 or 400, as well as the various equivalent embodiments disclosed herein, without the diffuser 112 present, allows determination of the pupil distribution with effects from both the illumination source aperture and the projection lens. Thus, the present invention provides a device and method for separating the effects of these variables affecting the pupil image, and thereby provides for control and adjustment of the photolithographic process to a degree greater than in the prior art.

In one embodiment, the present invention relates to a method for determining projection lens pupil transmission distribution in a photolithographic imaging system. The method generally includes a step of providing a photolithographic imaging system, such as that described above. In one embodiment, the system includes a device including an illumination source; a transmissive reticle; an aperture layer having an illumination source side and a light emission side and including a plurality of openings therethrough. The method generally further includes a step of measuring first pupil intensity distribution of images formed by the openings in the aperture layer at an image plane while passing radiation from the illumination source through the reticle and the pinhole plate. The method further generally includes a step of mounting a diffuser on the illumination source side of the aperture layer. The diffuser is substantially as described above, and may be mounted at any of the described locations or equivalents thereof, with the proviso that the diffuser be mounted between the aperture layer and the illumination source. When the diffuser has been mounted, the method further generally includes a step of measuring second pupil intensity distribution of images formed by the pinhole plate at the image plane while passing radiation from the illumination source through the reticle, the diffuser and the aperture layer. When the intensity measurements have been obtained, the method thereafter includes a step of comparing the first and the second pupil intensity distributions to determine projection lens pupil transmission distribution.

In one embodiment, as described above, the diffuser eliminates or substantially alters contributions of the illumination source aperture uniformity from the pupil images.

In one embodiment, the openings in the aperture layer have a substantially same predetermined size and shape and are spaced apart from one another so that overlap between the pupil images at the image plane is avoided while measuring intensity and/or uniformity of the projection lens pupil images is enabled. This arrangement has been illustrated in FIGS. 5–7 and 12.

In one embodiment, use of the diffuser decouples contributions to the pupil image arising from the illumination source aperture uniformity from contributions arising from the projection lens.

When the radiation intensity distributions of the pupil images have been obtained with and without the diffuser present, the radiation intensity data can be used to determine illumination source aperture uniformity and projection lens pupil transmission distribution. As will be understood, the pupil images 124 are formed on the pupil plane 126, and are present as two dimensional images. As such, the intensity distribution of the radiation forming the pupil images can be plotted against (x,y) coordinates, and the radiation intensity at any point (x,y) may be expressed as $P_{(x,y)}$. The radiation intensity distributions may then be referred to as $P_{(x,y)\ diffuser}$ and $P_{(x,y)\ no\ diffuser}$. In accordance with one embodiment of the method of the present invention, the "first pupil intensity distribution", obtained without the diffuser, is defined as $P_{(x,y)\ no\ diffuser}$, and the "second pupil intensity distribution", obtained with the diffuser mounted in place, is defined as $P_{(x,y)\ diffuser}$. As set forth in the above discussion, the intensity distribution with the diffuser in place, $P_{(x,y)\ diffuser}$, approximates the radiation intensity distribution of the projection lens, i.e., the projection lens transmission distribution. The diffuser removes non-uniformity effects arising in the illumination source, for example, from the illumination source aperture. The radiation intensity may range from 0 to 1, with 0 representing no radiation, i.e., no transmission, and 1 representing 100% transmission. Thus, the following relationship is defined:

$$P_{(x,y)\ diffuser} \cong P_{(x,y)\ projection\ lens} \quad (1)$$

Furthermore, the following relationship is defined between the measured intensity distributions and the intensity distribution of the illumination source:

$$P_{(x,y)\ diffuser}/P_{(x,y)\ no\ diffuser} \cong P_{(x,y)\ illumination\ source} \quad (2)$$

As indicated in (2), the intensity differences with and without the diffuser in place can be used to approximate the intensity of the illumination source alone. Thus, in accordance with one embodiment of the present invention, use of the diffuser as defined herein allows one to obtain information relating to radiation intensity distributions from each of the illumination source and the projection lens separately and together.

The pupil intensities can be measured by various light intensity distribution measurement devices known in the art. For example, in one embodiment, the measurement may be by exposing a photographic plate or material. In another embodiment, the measurement may be by an optical detector such as a CCD, CMOS-pixel sensor or other electronic detector. Thus, in one embodiment, the light intensity distribution measurement device has, e.g., a solid-state image sensing element on which many pixels are two-dimensionally arrayed. Other suitable devices and methods for obtaining the intensity distributions of the pupil images include use of photoresist or other photo-chemical materials. In any case, the response of the radiation-sensing material or device should be related to or proportional to the radiation intensity at the (x,y) location at which the measurement is taken.

As described, the diffuser decouples contributions to the pupil image arising from the illumination source aperture uniformity from contributions arising from the projection lens. This allows determination of pupil intensity distributions with and without the diffuser, which corresponds to the projection lens pupil transmission distribution and the illumination source aperture uniformity, respectively, to be determined. From these foregoing measurements and with use of the equations, detailed information can be obtained relating to the relative contributions to pupil image uniformity in an photolithographic imaging system, in accordance with the present invention.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, additional arrangements of the reticle, the diffuser and the aperture layer are possible.

INDUSTRIAL APPLICABILITY

The present invention relates to photolithographic lens systems and, more specifically, to a method and apparatus for determining projection lens transmission distribution while separating contributions of the illumination source aperture uniformity from the projection lens pupil transmission distribution. The invention provides a system that can efficiently obtain quantitative measurements of the illumination pattern at the wafer plane of the photolithographic lens system, while separating contributions to non-uniformity originating in the illumination source from contributions to non-uniformity originating in the projection lens system.

What is claimed is:

1. A device for determining projection lens pupil transmission distribution in a photolithographic imaging system, the device comprising:
   an illumination source;
   a transmissive reticle;
   an aperture layer having an illumination source side and a light emission side and comprising a plurality of openings therethrough;
   a diffuser removably mounted on the illumination source side of the aperture layer;
   a projection lens system; and
   an image plane,
   wherein a pupil image corresponding to each of the plurality of openings in the aperture layer is formed at the image plane when radiation from the illumination source passes through the reticle, the diffuser, the aperture layer and the projection lens system, the pupil image having a projection lens pupil transmission distribution,
   wherein the diffuser may be removed for determination of the pupil transmission distribution.

2. A device as in claim 1, wherein the diffuser eliminates or substantially alters contributions of the illumination source aperture uniformity from the projection lens pupil transmission distribution.

3. A device as in claim 1, wherein the diffuser is configured to be oscillated during operation of the device.

4. A device as in claim 1, wherein the diffuser at least partially homogenizes or randomizes one or more of intensity, spatial intensity distribution, phase, coherence and propagation direction of the radiation passing therethrough.

5. A device as in claim 1, wherein the diffuser is on an illumination source side of the reticle and the aperture layer is on a light emission side of the reticle.

6. A device as in claim 1, wherein both the diffuser and the aperture layer are on an illumination source side of the reticle.

7. A device as in claim 1, wherein both the diffuser and the aperture layer are on a light emission side of the reticle.

8. A device as in claim 1, wherein at least one of the diffuser and the aperture layer are supported by a frame.

9. A device as in claim 1, wherein at least one of the diffuser and the aperture layer are formed on a surface of the reticle.

10. A device as in claim 1, wherein at least one of the diffuser and the aperture layer are at least partially surrounded by or within the reticle and are supported thereby.

11. A device as in claim 1, wherein the image plane is substantially coplanar with a focal plane of light from the projection lens.

12. A method for determining projection lens pupil transmission distribution and illumination source aperture uniformity in a photolithographic imaging system, comprising:
   providing a photolithographic imaging system comprising:
      an illumination source;
      a transmissive reticle;
      an aperture layer having an illumination source side and a light emission side and comprising a plurality of openings therethrough; and
      a projection lens system;
   measuring first pupil intensity distribution of pupil images formed at an image plane by the openings in the aperture layer while passing radiation from the illumination source through the reticle, the aperture layer plate and the projection lens system;
   mounting a diffuser on the illumination source side of the aperture layer;
   measuring second pupil intensity distribution of images formed at the image plane by the openings in the aperture layer while passing radiation from the illumination source through the reticle, the diffuser, the aperture layer plate and the projection lens system; and
   comparing the first and the second pupil intensity distributions to determine intensity distribution of radiation emanating from the illumination source and the projection lens system.

13. A method as in claim 12, wherein the diffuser eliminates, substantially alters and/or decouples contributions to the pupil image arising from the illumination source aperture uniformity from the projection lens pupil transmission distribution.

14. A method as in claim 12, further comprising oscillating the diffuser while measuring second pupil intensity.

15. A method as in claim 12, wherein the first pupil intensity distribution substantially corresponds to combined effects of illumination source intensity distribution and projection lens pupil transmission distribution, and the second pupil intensity distribution substantially corresponds to projection lens pupil distribution.

16. A method as in claim 12, wherein the diffuser at least partially homogenizes or randomizes one or more of intensity, spatial intensity distribution, phase, coherence and propagation direction of the radiation passing therethrough.

17. A device for determining both illumination source aperture uniformity and projection lens pupil transmission distribution in a photolithographic imaging system, the device comprising:

an illumination source;
a transmissive reticle;
an aperture layer having an illumination source side and a light emission side and comprising a plurality of openings therethrough;
a diffuser removably mounted on the illumination source side of the aperture layer;
a projection lens system; and
an image plane,
wherein a first pupil image corresponding to each of the plurality of openings in the aperture layer is formed at the image plane when the diffuser is removed and radiation from the illumination source passes through the reticle, the aperture layer and the projection lens system, the first pupil image having a first pupil intensity distribution $P_{(x,y)\ no\ diffuser}$; and
wherein a second pupil image corresponding to each of the plurality of openings in the aperture layer is formed at the image plane when the diffuser is mounted and radiation from the illumination source passes through the reticle, the diffuser, the aperture layer and the projection lens system, the second pupil image having a second pupil intensity distribution $P_{(x,y)\ diffuser}$, and wherein the following relationships are defined:

$$P_{(x,y)\ diffuser} \cong P_{(x,y)\ projection\ lens} \quad (1)$$

and $$P_{(xy)\ diffuser} / P_{(x,y)\ no\ diffuser} \cong P_{(x,y)\ illumination\ source} \quad (2).$$

18. A device as in claim 17, wherein the diffuser eliminates, substantially alters and/or decouples contributions to the pupil image arising from the illumination source aperture uniformity from the projection lens pupil transmission distribution.

19. A device as in claim 17, wherein the diffuser is configured to be oscillated during operation of the device.

20. A device as in claim 17, wherein the diffuser at least partially homogenizes or randomizes one or more of intensity, spatial intensity distribution, phase, coherence and propagation direction of the radiation passing therethrough.

* * * * *